United States Patent [19]

Rohloff

[11] 4,394,434
[45] Jul. 19, 1983

[54] PLATING RESIST WITH IMPROVED RESISTANCE TO EXTRANEOUS PLATING

[75] Inventor: Robert R. Rohloff, Afton, Minn.

[73] Assignee: Minnesota Mining and Manufacturing Company, St. Paul, Minn.

[21] Appl. No.: 282,180

[22] PCT Filed: Jul. 15, 1980

[86] PCT No.: PCT/US80/00876

§ 371 Date: Dec. 8, 1980

§ 102(e) Date: Dec. 8, 1980

[87] PCT Pub. No.: WO81/00310

PCT Pub. Date: Feb. 5, 1981

[51] Int. Cl.$^3$ .................................................. G03C 1/68
[52] U.S. Cl. ..................................... 430/270; 430/278; 430/313; 430/314; 430/315; 430/324; 430/325; 430/326; 430/905; 430/908; 430/909; 430/910
[58] Field of Search .............. 430/270, 313, 314, 315, 430/324, 905, 908, 909, 910, 278, 325, 326; 260/37 R, 37 M, 37 EP

[56] References Cited

U.S. PATENT DOCUMENTS

| 3,600,330 | 8/1971 | Schneble et al. | 430/313 |
| 3,743,537 | 7/1973 | Honjo et al. | 430/65 |
| 3,754,920 | 8/1973 | Kuchta | 430/278 |
| 3,801,427 | 4/1974 | Morishita et al. | 428/302 |
| 3,958,996 | 3/1976 | Inskip | 430/198 |
| 4,308,312 | 12/1981 | Urban | 428/241 |

FOREIGN PATENT DOCUMENTS 201301 4/1955 Australia ............................ 430/84

OTHER PUBLICATIONS

Degussa Technical Bulletin No. 56

Primary Examiner—J. Travis Brown
Attorney, Agent, or Firm—Cruzan Alexander; Donald M. Sell; David R. Cleveland

[57] ABSTRACT

Deposition of extraneous metal on the surface of an electroless or electrolytic plating resist is reduced by dispersing into the resist formulation fumed aluminum oxide microparticles.

23 Claims, No Drawings

PLATING RESIST WITH IMPROVED RESISTANCE TO EXTRANEOUS PLATING

This is a continuation-in-part of application Ser. No. 57,980, filed July 16, 1979, now abandoned.

TECHNICAL FIELD

This invention relates to improved plating resists containing finely divided fillers.

BACKGROUND ART

In printed circuit board manufacture, a plating resist pattern controls where electrolytic or electroless deposition of metal takes place. Therefore, a plating resist should not take up undesired metal deposits on its surface during the plating step. Such undesired metal deposits will be referred to herein as "extraneous metal". Extraneous metal deposition is generally not a problem with state of the art electrolytic plating resists. However, due to the severity of electroless bath conditions and the longer immersion times generally employed, state of the art electroless plating resists are susceptible to the deposition of extraneous metal. These resists may also be physically attacked by the electroless plating bath, leading to bath contamination. In electroless copper plating, extraneous copper deposition is a particularly severe problem, due to the extended immersion times required to produce the desired thick copper layers and the highly alkaline conditions (e.g. 10 hours at pH 12-13 and 61° C. (142° F.) for a 0.0025 cm (1.0 mil) coating). The extraneous copper so deposited may range from a loosely adhering dust to tightly bonded overplating. Accordingly, individual inspection is required to detect such extraneous copper. If possible, the unwanted particles are removed by brushing. A substantial percentage of printed circuit boards (PCB's) cannot be so corrected and must be etched bare and reworked, an expensive and time consuming process.

The susceptibility of plating resists to extraneous metal deposition is frequently aggravated due to the presence of fillers commonly used in such resists. Two types of fillers are typically used in plating resists; namely, thixotropic fillers, herein referred to as thixotropes; and extender fillers, herein referred to as extenders. Thixotropes are finely divided substances which, when dispersed into a resist, cause the resist to exhibit shear thinning, e.g. low viscosity when forced through a screen but high viscosity when no force is applied. This improves screen printing performance by allowing an intricate pattern to be printed without deterioration of the pattern before it has cured. Thixotropic screen printable resists are usually cured by methods other than solvent drying (e.g., actinic radiation and visible light cure). Thixotropes which have been used in such resists include untreated fumed silicas (e.g. "Cab-O-Sil M5", commercially available from Cabot Corp.); treated fumed silicas (e.g. "Aerosil R-972", commercially available from DeGussa); and organic materials (e.g. "Thixcen R", commercially available from Baker Castor Oil Co.).

Extenders are frequently added to solvent-dried screen printable resists and to photoresists in order to increase the viscosity of the plating resist (which may be desired to improve the handling characteristics) and reduce the cost of the product by diluting it. Talc, calcium carbonate and precipitated silicas have all been used as extenders.

Unfortunately, the addition of the fillers discussed above (whether thixotropes or extenders) to plating resists increases their tendency to attract extraneous metal. Thixotropic screen printable resists subjected to electroless copper plating are especially susceptible to extraneous copper deposition. In order to obtain good resistance to extraneous copper deposition, the screen printing resists of the prior art have employed heat cured two part resists. These resists must be mixed before application and used within a few hours of mixing. The heat curing step necessitates a lengthy baking operation and a large processing area. Heat cured resists tend to thin out and flow onto uncoated areas of the PCB during the heat curing step, thereby limiting attainable pattern definition. Actinic radiation cured screen printing resists would be preferred to these heat cured resists since they need not be mixed before use, are cured with a faster and more energy efficient means than baking, do not require a large processing area, and offer improvements in attainable pattern definition. However, actinic radiation cured screen printing resists of the prior art have failed to combine good resistance to extraneous metal deposition (especially extraneous copper) with good screen printing performance.

Copying papers coated with various photoconductive materials (including aluminum oxide) suspended in an electrically insulating film-forming vehicle have been described in Australian Pat. No. 201,301.

Insulating compositions which are catalytic to the deposition of electroless metal, comprising inert solid particles of various materials (including "atomized alumina") with a minimum diameter between about 450 micrometers (40 mesh) and 21 micrometers (600 mesh), having a deposit thereon which comprises a cationic wetting agent in combination with one or more metals in elemental form selected from groups I-B or VIII of the Periodic Table of Elements are described in U.S. Pat. No. 3,600,330.

Photopolymerizable paste compositions useful for fabricating thick-film electronic circuits containing inorganic materials (including "inorganic oxides"), polymer binder, unsaturated monomers and an organic initiator dispersed in a hydrogenated terpene solvent have been described in U.S. Pat. No. 3,958,996.

An epoxy resin containing quartz powder, 0.25 percent fumed silica, and 0.15 percent aluminum oxide microparticles prepared by the flame hydrolysis of anhydrous aluminum chloride is shown in DeGussa Technical Bulletin No. 56, "Aluminum Oxide C, Titanium Dioxide P 25—Two Highly Dispersed Metal Oxides from DeGussa Produced by the AEROSIL® Process".

None of the above references show or suggest hardenable plating resists containing sufficient fumed aluminum oxide microparticles to provide such resists with resistance to extraneous metal deposition.

DISCLOSURE OF INVENTION

The present invention provides hardenable plating resist compositions comprising an organic binder and a filler comprising an effective amount of finely divided microparticles of fumed aluminum oxide dispersed throughout said binder, said microparticles of aluminum oxide having a primary particle size less than about 0.1 micrometer in diameter. In one aspect, this invention relates to the use of such microparticles to reduce the tendency of the surface of a plating resist to become coated with extraneous (i.e. unwanted) metal during the plating process. In another aspect of the invention such microparticles are used alone or in combination with other fillers to impart thixotropy to liquid screen printable plating resists while reducing the tendency of the surface of such resists to become coated with extraneous metal. A further aspect of the invention relates to the use of such microparticles in an actinic radiation cured screen printable resist to eliminate or substantially inhibit extraneous metal deposition while maintaining the desirable screen printing and curing characteristics typically associated with such resists. The compositions of the invention are especially useful in additive plating processes.

The aluminum oxide microparticles used as fillers in the resists of the present invention comprise finely-divided highly dispersed particles of fumed aluminum oxide, said microparticles having a primary (i.e. individual rather than agglomerate) particle size less than about 0.1 micrometers in diameter. Use of such aluminum oxide microparticles tends to eliminate or strongly inhibit the deposition of extraneous metal, especially extraneous copper. Surprisingly, such deposition of extraneous metal is not inhibited when conventionally ground and classified aluminum oxide of a particle size as small as, e.g., 0.85 micrometers, is used in a standard resist formulation. Also, use of other microfine materials made by flame hydrolysis of an inorganic chloride (e.g. fumed silica) in a conventional resist formulation tends to aggravate the tendency of the resist to attract extraneous metal. While not desiring to be bound by theory, applicant suspects that the ability of the aluminum oxide microparticles used in this invention to inhibit the deposition of extraneous metal on the surface of a plating resist may be due to the tendency of such aluminum oxide microparticles to acquire a positive electrostatic charge, in contrast to the general tendency of most microfine materials (e.g. the various fumed silicas) to acquire a negative electrostatic charge.

Aluminum oxide microparticles as used in this invention also impart thixotropic properties to a resist, and therefore may be used to give good screen printing properties to a resist. Furthermore, addition of such aluminum oxide microparticles to a plating resist does not detract from the general curing, storage, or handling properties of such resists.

DETAILED DESCRIPTION

The plating resists of the present invention are prepared by combining fumed aluminum oxide microparticles with conventional plating resist formulations. Included among such conventional formulations are electroless plating resists containing binders comprising monomers or prepolymers such as epoxides, vinyls (e.g. vinyl esters and vinyl ethers), acrylates, polyesters, urethanes, and acrylics; as well as electrolytic plating resists containing binders comprising the above as well as vinyl alcohols, silicones, polyethers, phenolics, and cellulose esters. Such binders should be in liquid form, paste form, or solid form, depending upon the desired mode of resist application (e.g. liquids or pastes for screening resists and solids for dry film photoresists). The fumed aluminum oxide microparticles can be added in addition to or in place of any thixotropes or extenders already used in such resists. Such thixotropes or extenders include fumed silica (treated or untreated), precipitated silica, talc, calcium carbonate, and organic materials. The fumed aluminum oxide microparticles can be combined with curable resists cured by a variety of conventional means, including actinic radiation and heat, i.e. infrared radiation. The fumed aluminum oxide microparticles eliminate or strongly inhibit deposition of extraneous metal, especially extraneous copper. Fumed aluminum oxide microparticles are especially useful when combined with actinic radiation cured screen printable resists, because they overcome the deficiencies of such prior art resists by providing good resistance to extraneous metal deposition while preserving the good screen printing and curing characteristics typically associated with such resists.

Fumed aluminum oxide microparticles can also be used in addition to or in place of the extenders used in state-of-the-art solvent-dried screen printing resists in order to lower their susceptibility to extraneous metal deposition, especially extraneous copper deposited by the electroless method. In addition, fumed aluminum oxide microparticles can be used in addition to or in place of the extenders used in state-of-the-art liquid or dry film photoresists in order to reduce their susceptibility to extraneous metal deposition, especially extraneous copper applied by the electroless plating method. For example, fumed aluminum oxide microparticles can be used in dry film negative or positive photoresist compositions comprising carrier film and a photosensitive layer carried on said film that is adherable to a printed circuit board substrate, reacts when exposed to an imagewise pattern of light to provide imagewise differential removability from said substrate, and comprises photopolymerizable or photosolubilizable organic binder, a catalytic amount of photoinitiator for initiating imagewise reaction of said binder upon imagewise exposure of said photosensitive layer to light, and an effective amount of finely divided particles of fumed aluminum oxide dispersed throughout the binder.

Fumed aluminum oxide microparticles as described above are typically prepared by the flame hydrolysis of anhydrous aluminum halide such as anhydrous aluminum chloride. Such fumed aluminum oxide microparticles are commercially available from DeGussa under the trademarks "Aluminum Oxide C" and "ALOC".

The effective amount of fumed aluminum oxide microparticles which have been found to be useful for reducing extraneous metal deposition when combined with a plating resist ranges from about 1% up to about 30% of the total resist weight in a resist containing an epoxide or vinyl ester binder; from about 1% up to about 40% of the total resist weight in a resist containing an acrylate binder; or in general, from about 1% up to the maximum amount beyond which the binder resin will no longer completely wet the microparticles. Any effective amount appears to lower a resist's susceptibility to extraneous deposition of metal. The preferred amount depends upon the rheology of the unfilled resist, upon the size of the fumed aluminum oxide microparticles, and upon whether or not the resist is to be screen printed. In a screen printable resist, the addition of 10-20% by weight of fumed aluminum oxide microparticles is typically a preferred amount, offering good screen printing performance and complete or substantial elimination of extraneous metal deposition, especially extraneous copper deposition. In a non-screen printable resist, smaller quantities of fumed aluminum oxide microparticles may be preferred, i.e., typically 1 to 10% by weight, because high thixotropy is not required in such resists. Dry-film resists preferably contain about 1 to 30% by weight of fumed aluminum oxide microparticles. Fumed aluminum oxide microparticles can also be mixed with other thixotropes. For example, addition of 6% fumed aluminum oxide microparticles, e.g. "ALOC", and 2% of fumed silica, e.g., "Cab-O-Sil M5", to an epoxide based screenable resist provides a resist with thixotropy approximately equivalent to a 10–12% addition of "ALOC" alone, although such a resist containing both "ALOC" and "Cab-O-Sil M5" has less resistance to extraneous metal deposition than such a resist containing "ALOC" alone.

The effectiveness of aluminum oxide microparticles in inhibiting extraneous copper deposition is illustrated using several screen printable resists described in the examples which follow. Since no standard test for resistance to extraneous metal deposition exists, the following subjective test scale was used in connection with the specific examples:

| Extent and Tenacity of Extraneous Metal (E.M.) Deposit | Rating |
|---|---|
| No visible E.M. | 10 |
| Very little E.M., easily removed | 9 |
| Medium amount of E.M., moderately easy to remove | 8 |
| Medium amount of E.M., difficult to remove | 7 |
| Medium heavy amount of E.M., difficult to remove | 6 |
| Medium heavy amount of E.M., cannot remove | 5 |
| Heavy E.M., cannot remove | 4 |
| Very heavy E.M., cannot remove | 3 |
| E.M. beginning to look like copper plating | 2 |
| E.M. resembles rough copper plating | 1 |
| Resist appears to be fully plated | 0 |

Resists which would be useful commercially should score 7 or higher on the above scale. Resists with ratings of 7–8 are marginally acceptable, but some rework of plated substrates may be required. Resists with ratings of 9–10 are preferred.

Screen printing performance can be subjectively evaluated using a "tongue depressor" test as is well known in the art, in which a standard wooden tongue depressor is inserted into the liquid resist and then withdrawn. Satisfactory screening performance corresponds to the formation of "short" (approximately 0 to 10 cm long) strings or threads of resist at the trailing edge of the tongue depressor. Screening performance can also be objectively evaluated by measurement of viscosity at 5 and 50 rpm in accordance with ASTM test No. D-2196. A shear thinning index number is calculated by dividing the viscosity at 5 rpm by the viscosity at 50 rpm. A shear thinning index number greater than about 1.25 indicates satisfactory screening performance. A shear thinning index number greater than about 2 indicates good screening performance.

The invention can be further understood by reference to the following examples, in which all parts are by weight unless otherwise indicated.

EXAMPLE 1

A hardenable resist was prepared with the following ingredients in the amounts stated:

| | |
|---|---|
| "EPI REZ 50727" epoxy resin (commercially available from Celanese Corp.) | 42.0g |
| "DER 332" epoxy resin (commercially available from Dow Chemical Co.) | 40.0g |
| "EPI REZ 5048" epoxy resin (commercially available from Celanese Corp.) | 10.0g |
| Triarylsulfonium hexafluoroantimonate photoinitiator | 2.5g |
| "Foamaster DF-160L" defoamer (commercially available from Diamond Shamrock) | 1.5g |
| Blue pigmentation | 1.0g |
| "ALOC" fumed aluminum oxide microparticles (commercially available from DeGussa) | 4.0g |
| | 101.0g |

The three epoxy resins were mixed together with heating at 60° C. (150° F.). The triarylsulfonium hexafluoroantimonate photoinitiator was prepared in accordance with the preferred method of U.S. Pat. No. 4,173,476, and added with stirring at the same temperature. This mixture was filtered through three layers of cheese cloth to remove undissolved particles. The blue pigmentation (an aid to visual inspection of the cured product) was prepared by dispersing a 1:2 mixture of "Milori Blue" powdered pigment (commercially available pigment from Harshaw Chemical Co. having a color index designation of "77510" and a color index name of "pigment blue 27") and "ERL 4221" epoxy resin (commercially available from Union Carbide Chemical Co.) in a 3 roll mill. The pigmentation and defoaming agents were then added to the above epoxy resin/photoinitiator mixture with stirring. The fumed aluminum oxide microparticles were added and dispersed by passing the mixture twice through a three roll mill (commercially available from Global Process Equip. Corp., Hauppage, N.Y., model 4×8) with both roller gaps set at 0.0152 cm (6 mils). The resultant mixture was then de-aerated using a vacuum pump and bell jar assembly.

Approximately 5 g of this mixture was applied to a conventional PCB substrate and spread over the substrate surface using a #14 Meyer bar (commercially available from RD Specialties, Webster, N.Y.), resulting in a uniform wet film approximately 0.0032 cm (1.26 mils) in thickness. Meyer bar application gave a reproducible film more convenient for testing purposes than actual screening of a circuitry pattern.

The mixture was then cured in place by passing the PCB substrate three times through a conventional single lamp 78.7 watt/cm (200 watt/in) ultraviolet radiation curing machine at 47.2 cm/minute (10 ft/min) belt speed. This is equivalent to a power density integral of 0.45 watt-sec/$cm^2$ (3 passes at 0.15 watt-sec/$cm^2$) as measured using an Ashdee Power Density Analyzer measuring the 3650 Angstrom line.

The PCB substrate was then electroless copper plated to a thickness of approximately 0.0025 cm (1.0 mil) in a copper sulfate-formaldehyde electroless copper bath ("Add Tech HiD-410", commercially available from Photocircuits Division of Kollmorgan, Inc.).

The plated PCB exhibited no visible extraneous copper on the resist surface (a subjective score of "10" on the extraneous metal rating scale).

COMPARATIVE EXAMPLES 1 to 5

Using the method of Example 1, the following fillers were substituted for the 4 g of fumed aluminum oxide microparticles (a 3.96% filler addition) used in the resist of Example 1.

| Comparative Example No. | Filler | Extraneous Metal Rating |
|---|---|---|
| 1 | 4g "Cab-O-Sil M5" untreated fumed silica (commercially available from Cabot Corp.) | 6 |
| 2 | 4g "Winnofil S" precipitated calcium carbonate treated with calcium stearate (commercially available from Imperial Chemical Industries, Ltd.) | 7–8 |
| 3 | 4g "OK-412" treated fumed silica (commercially available from DeGussa) | 6–7 |
| 4 | 4g "TS-100" treated fumed silica (commercially available from DeGussa) | 6–7 |
| 5 | 4g "R-972" treated fumed silica (commercially available from DeGussa) | 6 |

EXAMPLE 2

A test formulation was prepared as follows using the method of Example 1.

| | |
|---|---|
| "EPI-REZ 5048" epoxy resin | 30.0g |
| "DER 332" epoxy resin | 35.0g |
| "DEN 438" epoxy resin (commercially available from Dow Chemical Co.) | 15.0g |
| Triarylsulfonium hexafluoroantimonate photoinitiator | 2.5g |
| "DF-160L" defoamer | 1.5g |
| Blue pigmentation | 1.0g |
| "ALOC" | 14.0g |
| | 99.0g |

This formulation was run through an electroless copper plating bath as used in Example 1. The plated PCB's scored a "10" on the extraneous metal rating scale.

COMPARATIVE EXAMPLES 6 to 7

Using the method of Example 2, two ground and classified aluminum oxide fillers were substituted for the 14 g of fumed aluminum oxide microparticles used in the resist of Example 2.

In Comparative Example 6, the filler used was 14 g of "RC-152 DBM" (commercially available from Reynolds Chemicals, division of Reynolds Metals Company), a ground and classified aluminum oxide having a mean particle diameter of 1.4 micrometers. The plated PCB's scored a "7" on the extraneous metal rating scale.

In Comparative Example 7, the filler used was 14 g of "RC-HPT DMB" (commercially available from Reynolds Chemicals, division of Reynolds Metals Company), a ground and classified aluminum oxide having a mean particle diameter of 0.85 micrometers. The plated PCB's scored a "7" on the extraneous metal rating scale, and the extraneous metal was more tightly held to the resist than the extraneous metal of Comparative Example 6.

EXAMPLES 3 to 8

Using the method of Example 1, the following mixtures of fumed aluminum oxide microparticles and untreated fumed silica were substituted for the filler used in the resist of Example 1 to evaluate whether any synergism results from mixture of thixotropes. Data for Example 1 are included in the table below for comparative purposes:

| Example No. | Filler | Extraneous Metal Rating |
|---|---|---|
| 1 | 4.0g "ALOC"/0.0g "Cab-O-Sil M5" | 10 |
| 3 | 3.6g "ALOC"/0.4g "Cab-O-Sil M5" | 8 |
| 4 | 3.0g "ALOC"/1.0g "Cab-O-Sil M5" | 5–6 |
| 5 | 2.4g "ALOC"/1.6g "Cab-O-Sil M5" | 5–6 |
| 6 | 1.8g "ALOC"/2.2g "Cab-O-Sil M5" | 5–6 |
| 7 | 1.2g "ALOC"/2.8g "Cab-O-Sil M5" | 6–7 |
| 8 | 0.6g "ALOC"/3.4g "Cab-O-Sil M5" | 6–7 |

EXAMPLE 9

A test formulation was prepared as follows using the method of Example 1.

| | |
|---|---|
| "DER 332" epoxy resin | 85.0g |
| "DEN 438" epoxy resin | 7.0g |
| Triarylsulfonium hexafluoroantimonate photoinitiator | 2.5g |
| "DF-160L" defoamer | 1.5g |
| Blue pigmentation | 1.0g |
| Filler | 3.0g |
| | 100.0g |

Set out below in tabular form are results for several different fillers used in the above formulation:

| Run No. | Filler | Extraneous Metal Rating |
|---|---|---|
| 9a | 3g "ALOC" | 10 |
| 9b | 3g "Cab-O-Sil M5" | 6–7 |
| 9c | 3g "Winnofil S" | 8–9 |
| 9d | 3g "OK-412" | 8–9 |
| 9e | 3g "TS-100" | 7 |
| 9f | 3g "R-972" | 7 |

EXAMPLE 10

Using the method of Example 1, the following mixtures of fumed aluminum microparticles and untreated fumed silica were substituted for the 3 g of filler used in the resists of Example 9 to evaluate whether any synergism results from mixtures of thixotropes.

| Run No. | Filler | Extraneous Metal Rating |
|---|---|---|
| 10a | 2.70g "ALOC"/0.30g "Cab-O-Sil M5" | 9 |
| 10b | 2.25g "ALOC"/0.75g "Cab-O-Sil M5" | 8 |
| 10c | 1.80g "ALOC"/1.20g "Cab-O-Sil M5" | 7–8 |
| 10d | 1.35g "ALOC"/165g "Cab-O-Sil M5" | 6–7 |
| 10e | 0.90g "ALOC"/2.10g "Cab-O-Sil M5" | 7–8 |
| 10f | 0.45g "ALOC"/2.55g "Cab-O-Sil M5" | 6 |

EXAMPLE 11

A test formulation was prepared as follows using the method of Example 1:

| | |
|---|---|
| "ERL 4221" epoxy resin (commercially available from Union Carbide Chemical Co.) | 21.0g |
| "NIAX 425" epoxy resin (commercially available from Union Carbide Chemical Co.) | 15.0g |
| "XD-7818" epoxy resin (commercially available from Dow Chemical Co.) | 9.0g |
| "DER 337" epoxy resin (commercially | |

-continued

| | |
|---|---|
| available from Dow Chemical Co.) | 46.0g |
| Diaryliodonium hexafluorophosphate photoinitiator | 2.0g |
| "DF-160L" defoamer | 2.0g |
| Blue pigmentation | 1.0g |
| Filler | 5.0g |
| | 101.0g |

The diaryliodonium hexafluorophosphate photoinitiator was prepared in accordance with the preferred method of U.S. Pat. No. 4,143,476.

Set out below in tabular form are results for two different fillers used in the above formulation:

| Run No. | Filler | Extraneous Metal Rating |
|---|---|---|
| 11a | 5g "ALOC" | 9-10 |
| 11b | 5g "Cab-O-Sil M5" | 6-7 |

EXAMPLE 12

A test formulation was prepared as follows using the method of Example 1:

| | |
|---|---|
| "DER 332" epoxy resin | 850g |
| "DEN 438" epoxy resin | 70g |
| Triarylsulfonium hexafluoroantimonate photoinitiator | 25g |
| "DF-160L" defoamer | 15g |
| Blue pigmentation | 10g |
| | 970g |

Varying amounts of fumed aluminum oxide microparticles and untreated fumed silica were added to portions of the above mixture in order to evaluate whether any synergism results from mixtures of thixotropes. The formulations were run through a deteriorated electroless plating bath (i.e., a bath which had exhibited a tendency to deposit excessive extraneous copper) and plated to a thickness of approximately 0.0025 cm (1.0 mil).

Set out below in tabular form are the experimental results:

| Run No. | Filler | Extraneous Metal Rating |
|---|---|---|
| 12a | 4.0g "ALOC" plus 96.0g unfilled resist (4% filler) | 10 |
| 12b | 6.0g "ALOC" plus 94.0g unfilled resist (6% filler) | 9-10 |
| 12c | 8.0g "ALOC" plus 92.0g unfilled resist (8% filler) | 9 |
| 12d | 10.0g "ALOC" plus 90.0g unfilled resist (10% filler) | 9 |
| 12e | 12.0g "ALOC" plus 88.0g unfilled resist (12% filler) | 9-10 |
| 12f | 14.0g "ALOC" plus 86.0g unfilled resist (14% filler) | 9 |
| 12g | 5.0g "Cab-O-Sil M5" plus 95.0g unfilled resist (5% filler) | 0 |

Runs 12b to 12g of Example 12 exhibited satisfactory screening performance.

EXAMPLE 13

A test formulation was prepared as follows using the method of Example 1:

| | |
|---|---|
| "EPI REZ 5048" epoxy resin | 400g |
| "DER 332" epoxy resin | 300g |
| "DEN 431" epoxy resin (commercially available from Dow Chemical Co.) | 200g |
| Triarylsulfonium hexafluoroantimonate photoinitiator | 25g |
| "DF-160L" defoamer | 15g |
| Blue pigmentation | 10g |
| | 950g |

Varying amounts of fumed aluminum oxide microparticles or untreated fumed silica were added to portions of the above mixture in order to evaluate the amount required for good screening performance.

The test formulations were run through the deteriorated electroless plating bath used in Example 12.

Set out below in tabular form are the experimental results:

| Run No. | Filler | Extraneous Metal Rating |
|---|---|---|
| 13a | 4.0g "ALOC" plus 96.0g unfilled resist (4% filler) | 10 |
| 13b | 6.0g "ALOC" plus 94.0g unfilled resist (6% filler) | 9 |
| 13c | 8.0g "ALOC" plus 92.0g unfilled resist (8% filler) | 8-9 |
| 13d | 10.0g "ALOC" plus 90.0g unfilled resist (10% filler) | 9-10 |
| 13e | 12.0g "ALOC" plus 88.0g unfilled resist (12% filler) | 8-9 |
| 13f | 14.0g "ALOC" plus 86.0g unfilled resist (14% filler) | 8-9 |
| 13g | 5.0g "Cab-O-Sil M5" plus 95.0g unfilled resist (5% filler) | 6-7 |

Runs 13b to 13g of Example 13 exhibited satisfactory screening performance.

EXAMPLE 14

An unfilled test formulation was prepared as follows using the method of Example 1:

| | |
|---|---|
| "EPI REZ 50727" epoxy resin | 400g |
| "DER 332" epoxy resin | 100g |
| "EPI REZ 5048" epoxy resin | 400g |
| Triarylsulfonium hexafluoroantimonate photoinitiator | 25g |
| "DF-160L" defoamer | 15g |
| Blue pigmentation | 10g |
| | 950g |

Varying amounts of fumed aluminum oxide microparticles or untreated fumed silica were added to portions of the above mixture in order to evaluate the amount required for good screening performance.

The test formulation were run through the deteriorated electroless plating bath used in Examples 12 and 13.

Set out below in tabular form are the experimental results:

| Run No. | Filler | Extraneous Metal Rating |
|---|---|---|
| 14a | 4.0g "ALOC" plus 96.0g unfilled resist (4% filler) | 7–8 |
| 14b | 6.0g "ALOC" plus 94.0g unfilled resist (6% filler) | 9–10 |
| 14c | 8.0g "ALOC" plus 92.0g unfilled resist (8% filler) | 9 |
| 14d | 10.0g "ALOC" plus 90.0g unfilled resist (10% filler) | 7 |
| 14e | 12.0g "ALOC" plus 88.0g unfilled resist (12% filler) | 8–9 |
| 14f | 14.0g "ALOC" plus 86.0g unfilled resist (14% filler) | 9–10 |
| 14g | 5.0g "Cab-O-Sil M5" plus 95.0g unfilled resist (5% filler) | 0 |

Runs 14b to 14g of Example 14 exhibited satisfactory screening performance.

EXAMPLE 15

A test formulation was prepared as follows using the method of Example 1:

| | |
|---|---|
| "DEN 431" epoxy resin | 46.0g |
| "Multron R-16" saturated polyester resin (commercially available from Mobay Chemical Co.) | 44.0g |
| "DER 332" epoxy resin | 11.5g |
| Triarylsulfonium hexafluoroantimonate photoinitiator | 2.5g |
| "DF-160L" defoamer | 1.5g |
| Blue pigmentation | 1.0g |
| "ALOC" fumed aluminum oxide microparticles | 5.0g |
| | 111.5g |

This formulation was run through an electroless copper plating bath as used in Examples 1 to 12. The plated PCB's scored a "9" on the extraneous metal rating scale.

EXAMPLE 16

A test formulation was prepared as follows using the method of Example 1:

| | |
|---|---|
| "Derakane 470" vinyl ester resin (commercially available from Dow Chemical Co.) | 92.0g |
| "Irgacure 651" 2,2-dimethoxy-2-phenylacetophenone photoinitiator (commercially available from Ciba-Geigy Corp) | 3.0g |
| "DF-160L" defoamer | 1.0g |
| Blue pigmentation | 1.0g |
| "ALOC" fumed aluminum oxide microparticles | 4.0g |
| | 101.0g |

This formulation was run through an electroless copper plating bath as used in Examples 1 to 12 and 15. The plated PCB's scored a "9" on the extraneous metal rating scale.

EXAMPLE 17

A test formulation was prepared as follows using the method of Example 1:

| | |
|---|---|
| "DEN 431" epoxy resin | 55.0g |
| "Derakane 510A" bromonated vinyl resin (commercially available from Dow Chemical Co.) | 37.0g |
| Triarylsulfonium hexafluoroantimonate photoinitiator | 2.0g |
| "Irgacure 651" photoinitiator | 1.0g |
| "DF-160L" defoamer | 1.0g |
| Blue pigmentation | 1.0g |
| "ALOC" fumed aluminum oxide microparticles | 3.0g |
| | 100.0g |

This formulation was run through an electroless copper plating bath as used in Examples 1 to 12, 15 and 16. The plated PCB's scored a "10" on the extraneous metal rating scale.

EXAMPLE 18

A test formulation was prepared as follows using the method of Example 1:

| | |
|---|---|
| "DER 337" epoxy resin | 68.0g |
| "Derakane 470" vinyl ester resin | 24.0g |
| Triarylsulfonium hexafluoroantimonate photoinitiator | 2.5g |
| "DF-160L" defoamer | 1.5g |
| Blue pigmentation | 1.0g |
| "ALOC" fumed aluminum oxide microparticles | 3.0g |
| | 100.0g |

This formulation was run through an electroless copper plating bath as used in Examples 1 to 12 and 15 to 17. The plated PCB's scored a "10" on the extraneous metal rating scale.

EXAMPLE 19

A test formulation was prepared as follows using the method of Example 1:

| | |
|---|---|
| "Melcril 4083" ethylene glycol acrylate phthalate monomer (commercially available from Daubert Chemical Co.) | 137.0g |
| Trimethylolpropane triacrylate | 30.0g |
| "Irgacure 651" photoinitiator | 6.0g |
| "DF-160L" defoamer | 2.0g |
| Green pigmentation | 3.0g |
| "ALOC" fumed aluminum oxide microparticles | 15.0g |
| | 193.0g |

The green pigmentation was prepared by dispersing 40 parts "Milori Blue" pigment and 60 parts "X-2825" cadium sulfide yellow pgiment (commercially available pigment from Hercules Chemical Co. having a color index designation of "77199" and a color index name of "Y-37") into 300 parts "Melcril 4083" monomer. The test formulation was then applied to several laminated copper PCB substream using a 220 mesh polyester screen, laying down approximately 0.0025 cm (1.0 mil) of resist in the form of a circuitry pattern. The substrates were then cured using the method of Example 1.

Several of the substrate samples were then exposed to a conventional nickel electrolytic plating bath ("Lectro-Nic 10-03S" process, commercially available from Sel-Rex Products), for 30 minutes at a current density of 3.72 amps/sq. meter (40 amps/sq. ft) to produce a 0.0025 cm (1.0 mil) nickel coating. The plated PCB's scored a "10" on the extraneous metal rating scale.

EXAMPLE 20

PCB substrates coated with the formulation of Example 19 were exposed to an 18.9 liter 60/40 tin/lead electrolytic plating bath prepared as follows:

| | |
|---|---|
| Stannous fluoroborate | 52 g/l |
| Lead fluoroborate | 30 g/l |
| Fluoroboric acid (48%) | 200 g/l |
| Peptone | 5 g/l |

The samples were precleaned in 10% HCl solution for 10 seconds and then plated in the above bath for 30 minutes at a current density of 2.32 amps/sq. meter (25 amps/sq. ft). The plated PCB's scored a "10" on the extraneous metal rating scale.

Various modifications and adaptions of the above formulations will be obvious to those skilled in the art without departing from the scope and spirit of the present invention.

What is claimed is:

1. A photohardenable resist composition comprising polymerizable organic binder, a photoinitiator capable of initiating polymerization of said binder upon exposure to actinic radiation, and an effective amount, greater than 1% by weight, of aluminum oxide microparticles dispersed throughout said binder, said aluminum oxide microparticles being made by the flame hydrolysis of anhydrous aluminum halide.

2. A composition according to claim 1 wherein said aluminum oxide is about 1 to 30% by weight of the total weight of said composition.

3. A composition according to claim 1 wherein said aluminum oxide is about 10 to 30% by weight of the total weight of said composition.

4. A composition according to claim 1 wherein said binder comprises epoxide.

5. A composition according to claim 1 wherein said binder comprises acrylate monomer.

6. A composition according to claim 1 wherein said binder comprises vinyl prepolymer.

7. A composition according to claim 1 wherein said binder comprises an epoxide, said photoinitiator comprises triarylsulfonium hexafluoroantimonate, and said aluminum oxide is about 10 to 20% by weight of the total weight of said composition.

8. A composition according to claim 1 further comprising an amount of fumed silica sufficient to impart to said composition a shear thinning index number greater than about 1.25.

9. A composition according to claim 1 wherein said aluminum oxide microparticles are made by the flame hydrolysis of anhydrous aluminum chloride and have a primary particle size less than about 0.1 micrometer in diameter.

10. A photohardenable resist composition comprising epoxide, triarylsulfonium hexafluoroantimonate, and about 10 to 20% by weight of fumed aluminum oxide microparticles made by the flame hydrolysis of anhydrous aluminum chloride.

11. A dry film negative photoresist composition comprising (1) carrier film and (2) a photosensitive layer carried on said film that is adherable to a printed circuit board substrate, reacts when exposed to an imagewise pattern of light to provide imagewise differential removability from said substrate, and comprises (a) photopolymerizable organic binder, (b) a catalytic amount of photoinitiator for initiating imagewise reaction of said binder upon imagewise exposure of said photosensitive layer to light, and (c) an effective amount, greater than 1% by weight, of aluminum oxide microparticles dispersed throughout said binder, said aluminum oxide microparticles being made by the flame hydrolysis of anhydrous aluminum halide.

12. A composition according to claim 11 wherein said aluminum oxide is about 1 to 30% by weight of the total weight of said composition.

13. A composition according to claim 12 wherein said aluminum oxide microparticles are made by the flame hydrolysis of anhydrous aluminum chloride and have a primary particle size less than about 0.1 micrometer in diameter.

14. A dry film positive photoresist composition comprising (1) carrier film and (2) a photosensitive layer carried on said film that is adherable to a printed circuit board substrate, reacts when exposed to an imagewise pattern of light to provide imagewise differential removability from said substrate, and comprises (a) photosolubilizable organic binder, (b) a catalytic amount of photoinitiator for initiating imagewise reaction of said binder upon imagewise exposure of said photosensitive layer to light, and (c) an effective amount, greater than 1% by weight, of aluminum oxide microparticles dispersed throughout said binder, said aluminum oxide microparticles being made by the flame hydrolysis of anhydrous aluminum halide.

15. A composition according to claim 10 wherein said aluminum oxide is about 1 to 30% by weight of the total weight of said composition.

16. A composition according to claim 15 wherein said aluminum oxide microparticles are made by the flame hydrolysis of anhydrous aluminum chloride and have a primary particle size less than about 0.1 micrometer in diameter.

17. A hardenable resist composition comprising an organic binder and from about 4 to 14% weight of the total weight of said composition of aluminum oxide microparticles dispersed throughout said binder, said aluminum oxide microparticles being made by the flame hydrolysis of anhydrous aluminum halide.

18. A printed circuit board having a plating resist pattern comprising a hardenable resist composition comprising an organic binder and an effective amount, greater than 1% by weight, of aluminum oxide microparticles dispersed throughout said binder, said aluminum oxide microparticles being made by the flame hydrolysis of anhydrous aluminum halide.

19. A printed circuit board in accordance with claim 18, wherein said plating resist pattern is hardened.

20. A printed circuit board having a plating resist pattern comprising a photohardenable resist composition according to claim 1.

21. A printed circuit board in accordance with claim 20, wherein said plating resist pattern is hardened.

22. A printed circuit board having a plating resist pattern comprising a photohardenable resist composition according to claim 10.

23. A printed circuit board in accordance with claim 22, wherein said plating resist pattern is hardened.

* * * * *